(12) United States Patent
Liu et al.

(10) Patent No.: US 6,670,274 B1
(45) Date of Patent: Dec. 30, 2003

(54) METHOD OF FORMING A COPPER DAMASCENE STRUCTURE COMPRISING A RECESSED COPPER-OXIDE-FREE INITIAL COPPER STRUCTURE

(75) Inventors: Chi-Wen Liu, Hsin-Chu (TW); Ying-Lang Wang, Tai-Chung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/261,967

(22) Filed: Oct. 1, 2002

(51) Int. Cl.$^7$ .................... H01L 21/302; H01L 21/461
(52) U.S. Cl. .................... 438/692; 438/720; 438/722; 438/699; 438/687; 438/691; 438/626; 438/633
(58) Field of Search ............... 438/626, 627, 438/631, 633, 645, 691, 692, 693, 697, 720, 722, 743, 744, 745, 687

(56) References Cited

U.S. PATENT DOCUMENTS

| | | | |
|---|---|---|---|
| 5,380,546 A | 1/1995 | Krishnan et al. | 427/126.1 |
| 5,451,551 A | 9/1995 | Krishnan et al. | 437/241 |
| 6,083,835 A | 7/2000 | Shue et al. | 438/687 |
| 6,103,625 A | 8/2000 | Marcyk et al. | 438/691 |
| 6,114,246 A | 9/2000 | Weling | 438/691 |
| 6,150,269 A * | 11/2000 | Roy | 438/687 |
| 6,251,786 B1 | 6/2001 | Zhou et al. | 438/692 |
| 6,258,713 B1 | 7/2001 | Yu et al. | 438/634 |
| 6,274,499 B1 | 8/2001 | Gupta et al. | 438/692 |
| 6,436,302 B1 * | 8/2002 | Li et al. | 216/38 |

OTHER PUBLICATIONS

Article entitled "Finding the Ultimate Copper Barrier and Seed," Peters; Semiconductor International; Jul. 2001; p. 23.

* cited by examiner

Primary Examiner—Amir Zarabian
Assistant Examiner—Khanh Duong
(74) Attorney, Agent, or Firm—George O. Saile; Stephen B. Ackerman; Stephen G. Stanton

(57) ABSTRACT

A method of forming a planarized final copper structure including the following steps. A structure is provided having a patterned dielectric layer formed thereover. The patterned dielectric layer having an opening formed therein. A barrier layer is formed over the patterned dielectric layer, lining the opening. An initial planarized copper structure is formed within the barrier layer lined opening, and is planar with the barrier layer overlying the patterned dielectric layer. The initial planarized copper structure is recessed below the barrier layer overlying the patterned dielectric layer a distance to form a recessed copper structure. Any copper oxide formed upon the recessed copper structure is removed. A conductor film is formed over the recessed, copper oxide-free initial copper structure and the barrier layer. The excess of the conductor film is removed from over the barrier layer, and the excess of the barrier layer overlying the patterned dielectric layer is removed, by a planarization process to form the planarized final copper structure. The planarized final copper structure comprising: the lower, recessed copper oxide-free initial copper structure; and an overlying planarized conductor film, wherein the overlying planarized conductor film isolates the lower, recessed copper oxide-free initial copper structure from the ambient atmosphere.

51 Claims, 2 Drawing Sheets

METHOD OF FORMING A COPPER DAMASCENE STRUCTURE COMPRISING A RECESSED COPPER-OXIDE-FREE INITIAL COPPER STRUCTURE

FIELD OF THE INVENTION

The present invention relates generally to semiconductor fabrication and more specifically to fabrication of copper damascene structures.

BACKGROUND OF THE INVENTION

As integrated circuit (IC) manufacturers move to copper (Cu) metallization for their most advanced products, protection of copper surfaces presents a big challenge for the back-end-of-line (BEOL) manufacturing processes. Copper damage, such as corrosion and oxidation, is often observed on wafers with open copper surfaces in the presence of moisture and/or acidic gasses.

Copper corrosion destroys the copper surface while copper oxidation results in poor adhesion both at Cu/barrier layer and Cu/stop layer systems. Copper oxide also enhances copper hillock during thermal processes.

U.S. Pat. Nos. 5,380,546 and 5,451,551 both to Krishnan et al. describes a multilevel metallization process using polishing.

U.S. Pat. No. 6,251,786 B1 to Zhou et al. describes a dual damascene interconnect with a silicon nitride (Si3N4) film 34 over the recessed dual damascene interconnect.

U.S. Pat. No. 6,258,713 B1 to Yu et al. describes a dual damascene interconnect with a TiN layer over the planarized dual damascene interconnect.

U.S. Pat. No. 6,274,499 B1 to Gupta et al. describes a dual damascene process with a dielectric cap 30.

U.S. Pat. Nos. 6,114,246 to Weling, 6,103,625 to Marcyk et al. and U.S. Pat. No. 6,083,835 to Shue et al. are related patents describing barrier/CMP stop layers over damascene structures.

The article entitled "Finding the Ultimate Copper Barrier and Seed," Peters; Semiconductor International; July 2001; page 23, describes various barrier/liner materials such as WN, TaN, TaN+Co, TiN and TiN+PVD Cu.

SUMMARY OF THE INVENTION

Accordingly, it is an object of one or more embodiments of the present invention to provide a copper damascene structure that protects the upper copper surface.

It is another object of one or more embodiments of the present invention to provide a method of forming a copper damascene structure that protects the upper copper surface.

Other objects will appear hereinafter.

It has now been discovered that the above and other objects of the present invention may be accomplished in the following manner. Specifically, a structure is provided having a patterned dielectric layer formed thereover. The patterned dielectric layer having an opening formed therein. A barrier layer is formed over the patterned dielectric layer, lining the opening. An initial planarized copper structure is formed within the barrier layer lined opening, and is planar with the barrier layer overlying the patterned dielectric layer. The initial planarized copper structure is recessed below the barrier layer overlying the patterned dielectric layer a distance to form a recessed copper structure. Any copper oxide formed upon the recessed copper structure is removed. A conductor film is formed over the recessed, copper oxide-free initial copper structure and the barrier layer. The excess of the conductor film is removed from over the barrier layer, and the excess of the barrier layer overlying the patterned dielectric layer is removed, by a planarization process to form the planarized final copper structure. The planarized final copper structure comprising: the lower, recessed copper oxide-free initial copper structure; and an overlying planarized conductor film, wherein the overlying planarized conductor film isolates the lower, recessed copper oxide-free initial copper structure from the ambient atmosphere.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
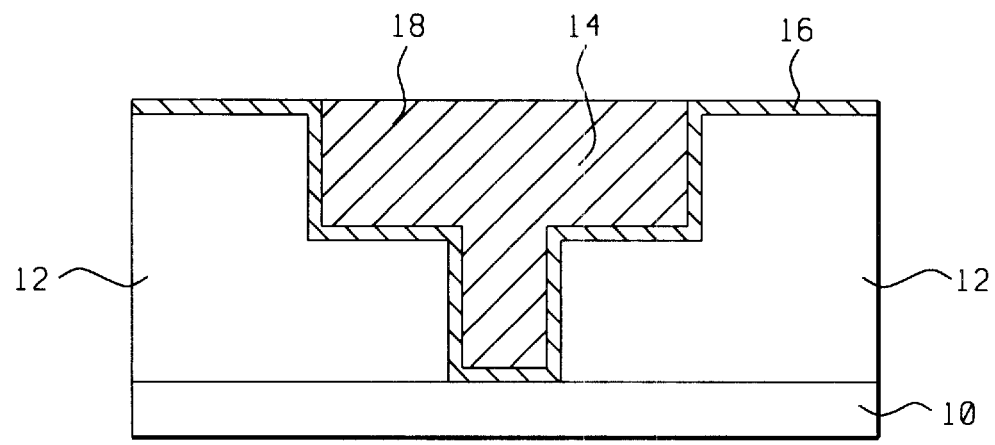
FIGS. 1 to 4 schematically illustrates a preferred embodiment of the present invention.

As shown in FIG. 1, structure 10 has a dielectric layer 12 formed thereover. Dielectric layer 12 includes opening 14 exposing a portion of structure 10. Opening 14 may be, for example, a dual damascene opening as shown in the FIGS. or a single damascene opening.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Dielectric layer 12 is preferably comprised of a low-k. material such as silicon oxide ($SiO_2$), FSG, a spin-on dielectric material, Black Diamond™ or nanoporous silica and is more preferably comprised of silicon oxide (oxide).

A barrier layer 16 is preferably formed over patterned oxide layer 12, lining dual damascene opening 14 to a thickness of preferably from about 50 to 1000 Å and more preferably from about 50 to 300 Å. Barrier layer 16 is preferably comprised of tantalum nitride (TaN), titanium nitride (TiN), tungsten nitride (WN), TaN+cobalt (Co), tantalum (Ta), titanium silicon nitride (TiSiN) or tantalum silicon nitride (TaSiN) and is more preferably TaN. TaN is more preferred because the addition of nitrogen (N) to tantalum (Ta) improves the stability of the barrier layer 16, possibly by segregation of nitrogen at the existing grain boundary.

An initial planarized copper structure 18 is formed within the barrier layer lined opening 14. If opening 14 is a dual damascene. opening as shown in the FIGS., then initial copper structure 18 is a planarized dual damascene structure, and if opening 14 is a single damascene opening, then initial copper structure 18 is a planarized single damascene structure. Initial planarized copper structure 18 is preferably formed using a copper chemical mechanical polish (CMP), stopping upon barrier layer 16.

Formation of Recessed Copper Structure 18'

Figure 2:
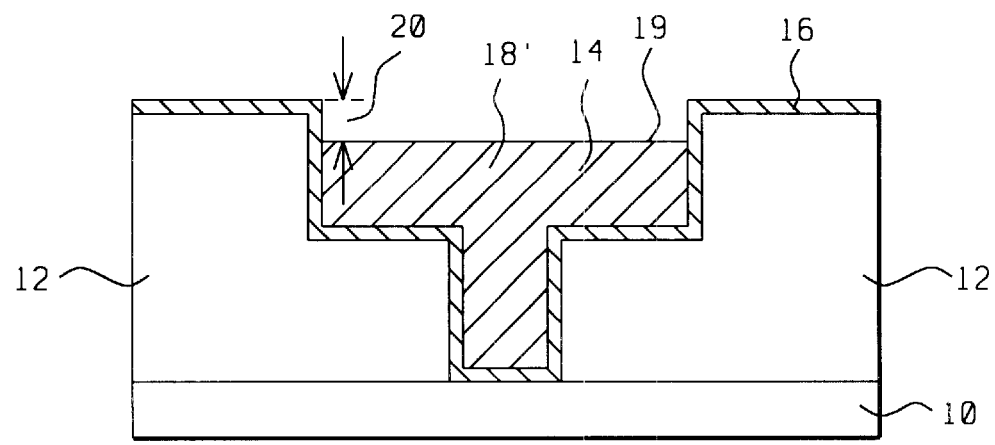

As shown in FIG. 2, initial planarized copper structure 18 is recessed 20 to form a recessed copper structure 18'.

Copper structure 18 is preferably recessed 20 from about 180 to 500 Å, more preferably from about 250 to 350 Å and most preferably 300 Å.

Initial planarized copper structure 18 is preferably recessed using a selective etch. process employing an aqueous solution preferably comprising:

(1) $NH_3/H_2O$;
(2) $NH_3/H_2O_2/H_2O$;
(3) $HNO_4/H_2O$;
(4) $HCl/H_2O$; or
(5) $H_2SO_4/H_2O$;

and more preferably comprising $NH_3/H_2O_2/H_2O$.

When using the more preferred $NH_3/H_2O_2/H_2O$ aqueous solution to selectively etch initial planarized copper structure 18 to form recessed copper structure 18', the following reaction occurs:

$$Cu + 4NH_3 + 1/2 O_2 + H_2O \rightarrow [Cu(NH_3)_4]^{++} + 2\ OH$$

where the copper complex $[Cu(NH_3)_4]^{++}$ product is formed on the top surface 19 of recessed copper structure 18'.

Removal of Copper Oxide From the Top Surface 19 of Recessed Copper Structure 18'

The structure is then subjected to a reducing treatment to remove any copper oxide ($CuO_x$) from the surface 19 of recessed copper structure 18'. The reducing treatment includes a plasma containing Cu reducing agent such as preferably $NH_3$, $H_2$ or $N_2$, and is more preferably $NH_3$ or $H_2$. The reduction treatment may take place in situ in a physical vapor deposition (PVD) tool.

The following reduction reaction takes place, for example, to remove the copper oxide ($CuO_x$):

$$Cu^{++}O_x + 2H \rightarrow Cu + H_2O$$

This reduces formation of copper oxide and facilitates removal of copper oxide.

Conductor Film 22 Deposition

Figure 3:
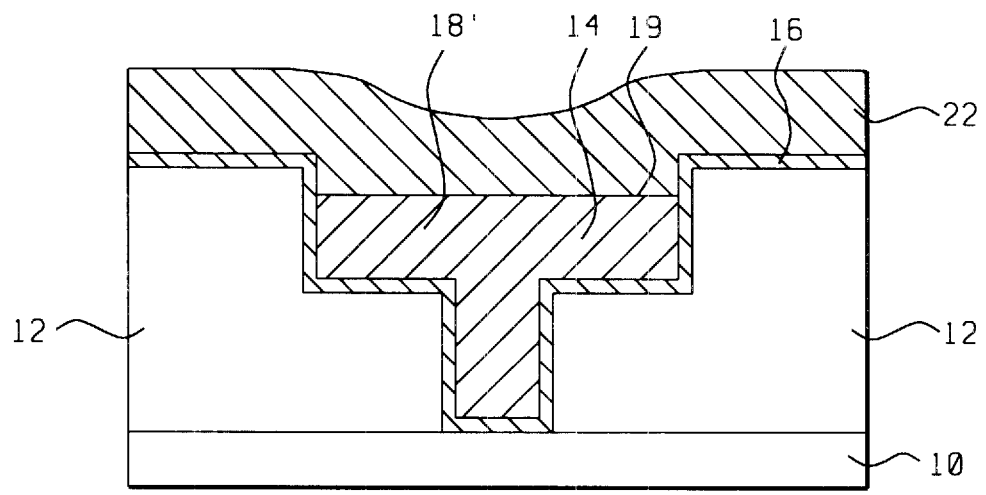

As illustrated in FIG. 3, a conductor layer 22 is deposited over recessed, copper oxide-free, initial copper structure 18' and barrier layer 16. The deposition of conductor layer 22 may be performed in situ in the same physical vapor deposition (PVD) tool as the copper-oxide-removal reduction treatment.

Conductor layer 22 is preferably comprised of tantalum nitride (TaN), titanium nitride (TiN), tungsten nitride (WN), TaN+cobalt (Co), tantalum (Ta), TaSiN or TiSiN and is more preferably TaN.

Conductor layer 22 is preferably deposited by a PVD process or a CVD process and more preferably by a PVD process.

Planarization of Conductor Layer 22

Figure 4:
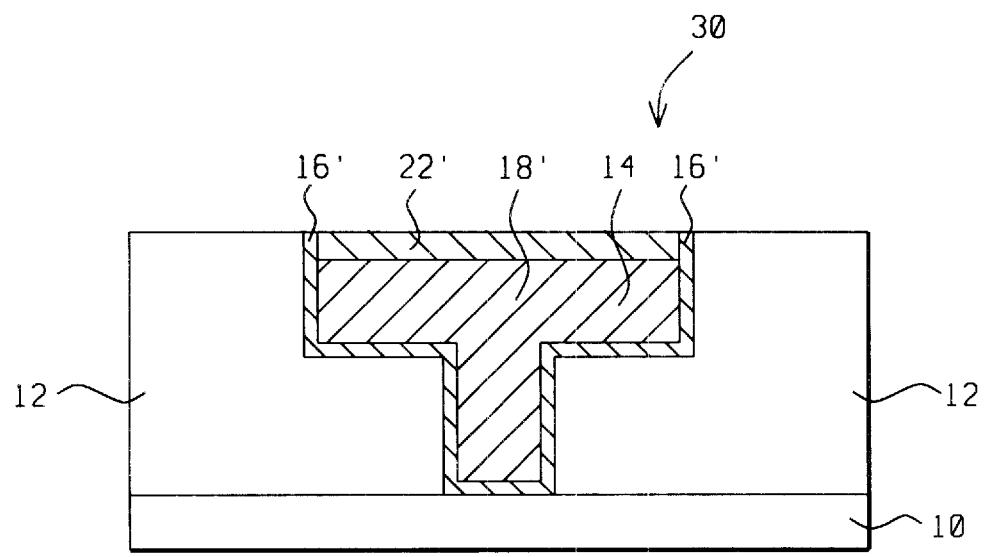

As shown in FIG. 4, the structure is planarized to remove the excess of conductor layer 22 and barrier layer 16 from over dielectric layer 12 to form a planarized final copper structure 30 within opening 14 comprising: (1) a lower oxide-free initial copper structure 18' with (2) an overlying planarized conductor layer 22. The structure is preferably planarized using a CMP process.

Because the lower oxide-free initial copper structure 18' is completely enclosed/covered by overlying planarized conductor layer 22, copper corrosion and oxidation of planarized final copper structure 30 can be avoided due to its isolation from moisture ($H_2O$) and acidic gasses/vapors/liquids.

Advantages of the Present Invention

The advantages of one or more embodiments of the present invention include:

1. Cu oxidation is avoided;
2. Cu corrosion is avoided; and
3. Cu hillock is reduced.

While particular embodiments of the present invention have been illustrated and described, it is not intended to limit the invention, except as defined by the following claims.

We claim:

1. A method of forming a planarized final copper structure, comprising the steps of:
   providing a structure having a patterned dielectric layer formed thereover; the patterned dielectric layer having an opening formed therein;
   forming a barrier layer over the patterned dielectric layer and lining the opening;
   forming an initial planarized copper structure within the barrier layer lined opening, planar with the barrier layer overlying the patterned dielectric layer;
   recessing the initial planarized copper structure below the barrier layer overlying the patterned dielectric layer a distance to form a recessed copper structure;
   removing any copper oxide formed upon the recessed copper structure;
   forming a conductor film over the recessed, copper oxide-free initial copper structure and the barrier layer;
   removing the excess of the conductor film over the barrier layer and the excess of the barrier layer overlying the patterned dielectric layer by a planarization process to form the planarized final copper structure; the planarized final copper structure comprising: the lower recessed, copper oxide-free initial copper structure; and an overlying planarized conductor film.

2. The method of claim 1, wherein the opening is a damascene opening or a dual damascene opening.

3. The method of claim 1, wherein the patterned dielectric layer is comprised of a material selected from the group consisting of: silicon oxide; FSG, a spin-on dielectric material, Black Diamond™ and nanoporous silica; the barrier layer is comprised of a material selected from the group consisting of: TaN; TiN; WN; TaN+Co; Ta, TiSiN and TaSiN; and the conductor film is comprised of a material selected from the group consisting of: TaN; TiN; WN; TaN+Co; Ta, TiSiN and TaSiN.

4. The method of claim 1, wherein the patterned dielectric layer is comprised of silicon oxide; the barrier layer is comprised of TaN; and the conductor film is comprised of TaN.

5. The method, of claim 1, wherein the distance the initial planarized copper structure is recessed below the barrier layer overlying the patterned dielectric layer is from about 180 to 500 Å.

6. The method of claim 1, wherein the distance the initial planarized copper structure is recessed below the barrier layer overlying the patterned dielectric layer is from about 250 to 210 Å.

7. The method of claim 1, wherein the distance the initial planarized copper structure is recessed below the barrier layer overlying the patterned dielectric layer is about 300 Å.

8. The method of claim 1, wherein the barrier layer has a thickness of from about 50 to 1000 Å.

9. The method of claim 1, wherein the barrier layer has a thickness of from about 50 to 300 Å.

10. The method of claim 1, wherein the initial planarized copper structure is recessed using a selective etch process.

11. The method of claim 1, wherein the initial planarized copper structure is recessed using a selective etch process employing an aqueous solution selected from the group consisting of $NH_3/H_2O$; $NH_3/H_2O_2/H_2O$; $HNO_4/H_2O$; $HCl/H_2O$ and $H_2SO_4/H_2O$.

12. The method of claim 1, wherein the initial planarized copper structure is recessed using a selective etch process employing an $NH_3/H_2O_2/H_2O$ aqueous solution.

13. The method of claim 1, wherein the copper oxide formed upon the recessed copper structure is removed using a reducing treatment.

14. The method of claim 1, wherein the copper oxide formed upon the recessed copper structure is removed using a reducing treatment employing a plasma copper reducing agent.

15. The method of claim 1, wherein the copper oxide formed upon the recessed copper structure is removed using a reducing treatment employing a plasma copper reducing agent selected from the group consisting of: $NH_3$; $H_2$ and $N_2$.

16. The method of claim 1, wherein the copper oxide formed upon the recessed copper structure is removed using a reducing treatment employing a plasma copper reducing agent selected from the group consisting of: $NH_3$ and $H_2$.

17. The method of claim 1, wherein the copper oxide formed upon the recessed copper structure is removed using a reducing treatment employing an $NH_3$ plasma copper reducing agent.

18. The method of claim 1, wherein the conductor film formation and the copper oxide removal are performed in situ in the same physical vapor deposition tool.

19. A method of forming a planarized final copper structure, comprising the steps of:
providing a structure having a patterned dielectric layer formed thereover; the patterned dielectric layer having an opening formed therein; the patterned dielectric layer being comprised of a material selected from the group consisting of: silicon oxide; FSG, a spin-on dielectric material, Black Diamond™ and nanoporous silica;
forming a barrier layer over the patterned dielectric layer and lining the opening; the barrier layer being comprised of a material selected from the group consisting of: TaN; TiN; WN; TaN+Co; Ta, TiSiN and TaSiN;
forming an initial planarized copper structure within the barrier layer lined opening, planar with the barrier layer overlying the patterned dielectric layer;
recessing the initial planarized copper structure below the barrier layer overlying the patterned dielectric layer a distance to form a recessed copper structure;
removing any copper oxide formed upon the recessed copper structure;
forming a conductor film over the recessed, copper oxide-free initial copper structure and the barrier layer; the conductor film being comprised of a material selected from the group consisting of: TaN; TiN; WN; TaN+Co; Ta, TiSiN and TaSiN;
removing the excess of the conductor film over the barrier layer and the excess of the barrier layer overlying the patterned dielectric layer by a planarization process to form the planarized final copper structure; the planarized final copper structure comprising: the lower recessed, copper oxide-free initial copper structure; and an overlying planarized conductor film.

20. The method of claim 19, wherein the opening is a damascene opening or a dual damascene opening.

21. The method of claim 19, wherein the patterned dielectric layer is comprised of silicon oxide; the barrier layer is comprised of TaN; and the conductor film is comprised of TaN.

22. The method of claim 19, wherein the distance the initial planarized copper structure is recessed below the barrier layer overlying the patterned dielectric layer is from about 180 to 500 Å.

23. The method of claim 19, wherein the distance the initial planarized copper structure is recessed below the barrier layer overlying the patterned dielectric layer is from about 250 to 350 Å.

24. The method of claim 19, wherein the distance the initial planarized copper structure is recessed below the barrier layer overlying the patterned dielectric layer is about 300 Å.

25. The method of claim 19, wherein the barrier layer has a thickness of from about 50 to 1000 Å.

26. The method of claim 19, wherein the barrier layer has a thickness of from about 50 to 300 Å.

27. The method of claim 19, wherein the initial planarized copper structure is recessed using a selective etch process.

28. The method of claim 19, wherein the initial planarized copper structure is recessed using a selective etch process employing an aqueous solution selected from the group consisting of $NH_3/H_2O$; $NH_3/H_2O_2/H_2O$; $HNO_4/H_2O$; $HCl/H_2O$ and $H_2SO_4/H_2O$.

29. The method of claim 19, wherein the initial planarized copper structure is recessed using a selective etch process employing an $NH_3/H_2O_2/H_2O$ aqueous solution.

30. The method of claim 19, wherein the copper oxide formed upon the recessed copper structure is removed using a reducing treatment.

31. The method of claim 19, wherein the copper oxide formed upon the recessed copper structure is removed using a reducing treatment employing a plasma copper reducing agent.

32. The method of claim 19, wherein the copper oxide formed upon the recessed copper structure is removed using a reducing treatment employing a plasma copper reducing agent selected from the group consisting of: $NH_3$; $H_2$; and $N_2$.

33. The method of claim 19, wherein the copper oxide formed upon the recessed copper structure is removed using a reducing treatment employing a plasma copper reducing agent selected from the group consisting of: $NH_3$ and $H_2$.

34. The method of claim 19, wherein the copper oxide formed upon the recessed copper structure is removed using a reducing treatment employing an $NH_3$ plasma copper reducing agent.

35. The method of claim 19, wherein the conductor film formation and the copper oxide removal are performed in situ in the same physical vapor deposition tool.

36. A method of forming a planarized final copper structure, comprising the steps of:
providing a structure having a patterned dielectric layer formed thereover; the patterned dielectric layer having an opening formed therein;
forming a barrier layer over the patterned dielectric layer and lining the opening; the barrier layer being comprised of a material selected from the group consisting of: TaN; TiN; WN; TaN+Co; Ta; TiSiN and TaSiN;
forming an initial planarized copper structure within the barrier layer lined opening, planar with the barrier layer overlying the patterned dielectric layer;

recessing the initial planarized copper structure below the barrier layer overlying the patterned dielectric layer a distance to form a recessed copper structure; the initial planarized copper structure being recessed using a selective etch process employing an aqueous solution selected from the group consisting of:
  i) $NH_3/H_2O$;
  ii) $NH_3/H_2O_2/H_2O$;
  iii) $HNO_4/H_2O$;
  iv) $HCl/H_2O$; and
  v) $H_2SO_4/H_2O$;
removing any copper oxide formed upon the recessed copper structure using a reducing treatment employing a plasma copper reducing agent selected from the group consisting of: $NH_3$; $H_2$ and $N_2$;
forming a conductor film over the recessed, copper oxide-free initial copper structure and the barrier layer; the conductor film being comprised of a material selected from the group consisting of: TaN; TiN; WN; TaN+Co; Ta, TiSiN and TaSiN;
removing the excess of the conductor film over the barrier layer and the excess of the barrier layer overlying the patterned dielectric layer by a planarization process to form the planarized final copper structure; the planarized final copper structure comprising: the lower recessed, copper oxide-free initial copper structure; and an overlying planarized conductor film.

37. The method of claim 36, wherein the opening is a damascene opening or a dual damascene opening.

38. The method of claim 36, wherein the patterned dielectric layer is comprised of a material selected from the group consisting of: silicon oxide; FSG, a spin-on dielectric material, Black Diamond™ and nanoporous silica.

39. The method of claim 36, wherein the patterned dielectric layer is comprised of silicon oxide; the barrier layer is comprised of TaN; and the conductor film is comprised of TaN.

40. The method of claim 36, wherein the distance the initial planarized copper structure is recessed below the barrier layer overlying the patterned dielectric layer is from about 180 to 500 Å.

41. The method of claim 36, wherein the distance the initial planarized copper structure is recessed below the barrier layer overlying the patterned dielectric layer is from about 250 to 350 Å.

42. The method of claim 36, wherein the distance the initial planarized copper structure is recessed below the barrier layer overlying the patterned dielectric layer is about 300 Å.

43. The method of claim 36, wherein the barrier layer has a thickness of from about 50 to 1000 Å.

44. The method of claim 36, wherein the barrier layer has a thickness of from about 50 to 300 Å.

45. The method of claim 36, wherein the initial planarized copper structure is recessed using a selective etch process.

46. The method of claim 36, wherein the initial planarized copper structure is recessed using a selective etch process employing an $NH_3/H_2O_2/H_2O$ aqueous solution.

47. The method of claim 36, wherein the copper oxide formed upon the recessed copper structure is removed using a reducing treatment.

48. The method of claim 36, wherein the copper oxide formed upon the recessed copper structure is removed using a reducing treatment employing a plasma copper reducing agent.

49. The method of claim 36, wherein the copper oxide formed upon the recessed copper structure is removed using a reducing treatment employing a plasma copper reducing agent selected from the group consisting of: $NH_3$ and $H_2$.

50. The method of claim 36, wherein the copper oxide formed upon the recessed copper structure is removed using a reducing treatment employing an $NH_3$ plasma copper reducing agent.

51. The method of claim 36, wherein the conductor film formation and the copper oxide removal are performed in situ in the same physical vapor deposition tool.

* * * * *